(12) United States Patent
Zhan

(10) Patent No.: US 7,816,463 B2
(45) Date of Patent: Oct. 19, 2010

(54) GLUE FOR PACKAGING LIGHT EMITTING DIODE AND USE THEREOF

(75) Inventor: Xian-wu Zhan, Yuyao (CN)

(73) Assignee: Ningbo Andy Optoelectronic Co., Ltd., Zhejiang (CN)

( * ) Notice: Subject to any disclaimer, the term of this patent is extended or adjusted under 35 U.S.C. 154(b) by 218 days.

(21) Appl. No.: 12/235,172

(22) Filed: Sep. 22, 2008

(65) Prior Publication Data

US 2010/0010125 A1    Jan. 14, 2010

(30) Foreign Application Priority Data

Dec. 20, 2007    (CN) .......................... 2007 1 0172633

(51) Int. Cl.
  *C08F 283/12* (2006.01)
(52) U.S. Cl. .................. 525/474; 525/477; 528/30; 528/31; 528/32; 528/33
(58) Field of Classification Search .................. 524/114, 524/261; 525/474, 477; 528/30, 31, 32, 528/33
See application file for complete search history.

(56) References Cited

U.S. PATENT DOCUMENTS 7,291,670 B2 * 11/2007 Fehn et al. .................. 524/588
2002/0119111 A1 * 8/2002 Kilgour et al. ............. 424/70.1

* cited by examiner

*Primary Examiner*—Randy Gulakowski
*Assistant Examiner*—Kyle Baumstein

(57) ABSTRACT

A glue for packaging a light emitting diode (LED) is described and includes a first set of compositions and a second set of compositions mixed based on a predetermined weight ratio. The first set of compositions is poly(dimethyl siloxane), and the second set of compositions includes a copolymer of dimethyl siloxane, methyl hydrogen siloxane, and vinyl siloxane. The copolymer in the second set of compositions has a weight percentage from about 94% to 99%, dimethyl siloxane in the copolymer has a weight percentage from about 84% to 90%, methyl hydrogen siloxane in the copolymer has a weight percentage from about 4% to 9%, and vinyl siloxane in the copolymer has a weight percentage from about 2% to 7%. A use of the glue for packaging a LED is also described.

6 Claims, 5 Drawing Sheets

US 7,816,463 B2

GLUE FOR PACKAGING LIGHT EMITTING DIODE AND USE THEREOF

FIELD OF THE INVENTION

The present invention relates to a light emitting diode (LED), and more particularly to a glue for packaging a LED and a use of the glue.

BACKGROUND OF THE INVENTION

Light emitting diodes (LEDs) are a kind of semiconductor lighting elements, and generally applied to indicators, display screens, and etc. Especially, a type of the LEDs is white LED (WLED) which can be used as a fourth-generation light source to replace fluorescent lamps and incandescent lamps. A theoretical life span of a LED is about 100,000 hours. However, an actual life span of a commercially-available white LED product is generally shorter than the theoretical time of 100,000 hours.

A glue (i.e. a resin or an adhesive) for packaging a light emitting diode (LED) is one of major factors affecting the luminance decay of the LED. Referring now to FIG. 1, a graph of a luminance decay profile of a traditional white LED (WLED) product manufactured by a domestic manufacturer A is illustrated, wherein the traditional white LED product is packaged by a traditional silica gel and continuously tested about 2520 hours under the room temperature of 25° C. and a constant current of 25 mA. The horizontal axis represents time and the vertical axis represents the luminous flux maintenance percentage. As shown, the rate of luminance decay at $168^{th}$ hour is 13%, the rate of luminance decay at $336^{th}$ hour is 20%, the rate of luminance decay at $504^{th}$ hour is 25%, the rate of luminance decay at $648^{th}$ hour is 31%, the rate of luminance decay at $1128^{th}$ hour is 49%, and the rate of luminance decay at $2520^{th}$ hour is 80%. For further verifying the luminance decay condition of the traditional white LED product, the traditional white LED product is continuously tested about 1032 hours under the room temperature of 25° C. and a constant current of 40 mA. Referring now to FIG. 2, a graph of a luminance decay profile of the traditional white LED product tested under the foregoing conditions is illustrated. As shown, the rate of luminance decay at $168^{th}$, $336^{th}$, $504^{th}$, and $1032^{th}$ hours is 34%, 55%, 68%, and even 88%, respectively. As a result, it is necessary to develop an innovative packaging glue to efficiently reduce the luminance decay of the LED product.

SUMMARY OF THE INVENTION

A primary object of the present invention is to provide a glue for packaging a light emitting diode (LED), which is used to solve the foregoing problems existing in the traditional LED product, so that a LED packaged by the glue of the present invention can provide advantages of reducing luminance decay, elongating life span, and lowering manufacture cost.

To achieve the above object, a glue for packaging a light emitting diode (LED) according to a preferred embodiment of the present invention is essentially consisting of a first set of compositions and a second set of compositions mixed based on a predetermined weight ratio, wherein the first set of compositions is poly(dimethyl siloxane) (i.e. PDMS), and the second set of compositions includes a copolymer of dimethyl siloxane, methyl hydrogen siloxane, and vinyl siloxane. The weight percentage of the copolymer in the second set of compositions has a weight percentage from about 94% to 99%, wherein the weight percentage of dimethyl siloxane in the copolymer has a weight percentage from about 84% to 90%, the weight percentage of methyl hydrogen siloxane in the copolymer has a weight percentage from about 4% to 9%, and the weight percentage of vinyl siloxane in the copolymer has a weight percentage from about 2% to 7%.

The weight percentage of the copolymer in the second set of compositions is preferably about 98%, wherein the weight percentage of dimethyl siloxane in the copolymer is preferably about 87%, the weight percentage of methyl hydrogen siloxane in the copolymer is preferably about 7%, and the weight percentage of vinyl siloxane in the copolymer is preferably about 4%.

Furthermore, the second set of compositions further includes γ-(2,3-epoxypropoxy)propyl trimethoxysilane (i.e. glycidyl γ-(trimethoxysilyl)propyl ether), wherein the weight percentage of γ-(2,3-epoxypropoxy)propyl trimethoxysilane in the second set of compositions has a weight percentage from about 0.5% to 3%.

The weight percentage of γ-(2,3-epoxypropoxy)propyl trimethoxysilane (i.e. γ-glycidyloxypropyl-trimethoxysilane) in the second set of compositions is preferably about 1%.

Moreover, the second set of compositions further includes triethoxy methyl siloxane, wherein the weight percentage of triethoxy methyl siloxane in the second set of compositions has a weight percentage from about 0.5% to 3%.

The weight percentage of triethoxy methyl siloxane in the second set of compositions is preferably about 1%.

The first set of compositions and the second set of compositions are mixed based on a weight ratio of 1:1.

In addition, according to a preferred embodiment of the present invention, a packaging use of the glue for packaging LED is also disclosed hereinafter.

In comparison with prior art, the glue for packaging LED according to the present invention is prepared by mixing the first set of compositions with the second set of compositions based on the predetermined weight ratio. The glue can be used as a glue for mixing phosphor powder during packaging white LED, or the glue also can be applied to form a transparent medium layer on a light emitting surface of a LED chip. As a result, the glue of the present invention is advantageous to apparently reduce the luminance decay of the LED, while the LED packaged by the glue can provide advantages of reducing luminance decay, elongating life span, and lowering manufacture cost.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

A preferred embodiment of the present invention discloses a glue (i.e. a resin) for packaging a light emitting diode (LED), wherein the glue is prepared by mixing a first set of compositions with a second set of compositions based on a predetermined weight ratio. Each of the first set of compositions and the second set of compositions is in a viscous liquid state, respectively. The first set of compositions is poly(dimethyl siloxane) (i.e. PDMS). The second set of compositions includes a main composition which is a copolymer of dimethyl siloxane, methyl hydrogen siloxane, and vinyl siloxane, wherein the copolymer is represented by the following formula I:

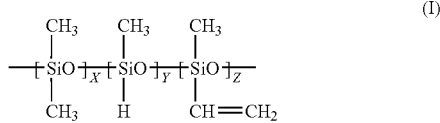

(I)

Meanwhile, the second set of compositions further includes γ-(2,3-epoxypropoxy)propyl trimethoxysilane (i.e. γ-glycidyloxypropyl-trimethoxysilane) and triethoxy methyl siloxane, as shown in the following formulas II and III, respectively:

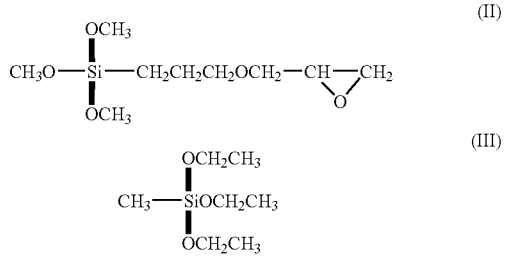

The weight percentage of the copolymer in the second set of compositions has a weight percentage from about 94% to 99%. In the preferred embodiment of the present invention, the weight percentage of the copolymer in the second set of compositions is preferably about 98%. Furthermore, the weight percentage of dimethyl siloxane in the copolymer has a weight percentage from about 84% to 90%, preferably is about 87%. The weight percentage of methyl hydrogen siloxane in the copolymer has a weight percentage from about 4% to 9%, preferably is about 7%. The weight percentage of vinyl siloxane in the copolymer has a weight percentage from about 2% to 7%, preferably is about 4%. Moreover, the second set of compositions further includes γ-(2,3-epoxypropoxy)propyl trimethoxysilane (i.e. glycidyl γ-(trimethoxysilyl)propyl ether), wherein the weight percentage of γ-(2,3-epoxypropoxy)propyl trimethoxysilane in the second set of compositions has a weight percentage from about 0.5% to 3%, preferably is about 1%. In addition, the second set of compositions further includes triethoxy methyl siloxane, wherein the weight percentage of triethoxy methyl siloxane in the second set of compositions has a weight percentage from about 0.5% to 3%, preferably is about 1%.

Figure 1:
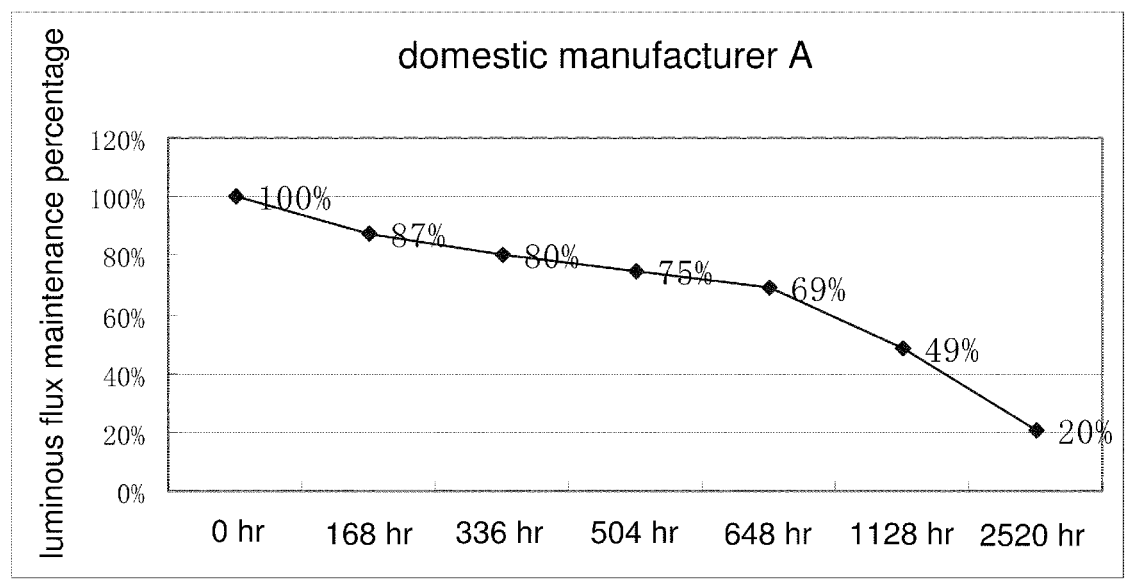
FIG. 1 is a graph of a luminance decay profile of a traditional white LED product manufactured by a domestic manufacturer A, wherein the LED product is continuously tested about 2520 hours under the same conditions: room temperature of 25° C. and constant current of 25 mA.
Figure 2:
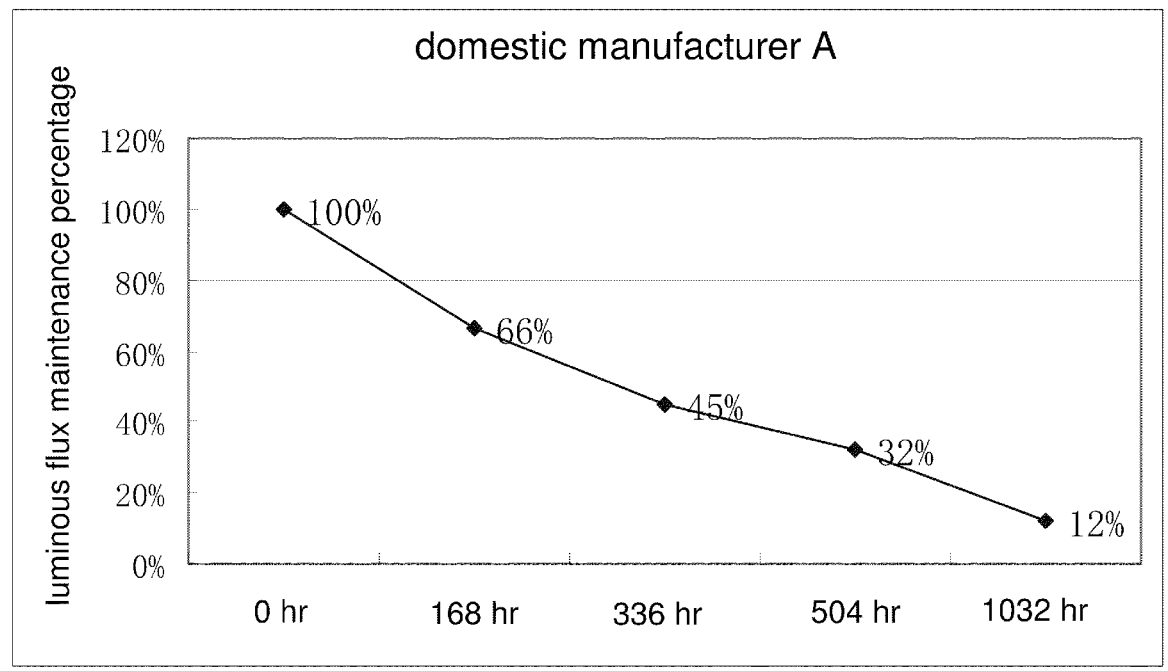
FIG. 2 is a graph of a luminance decay profile of the traditional white LED product manufactured by the domestic manufacturer A, wherein the LED product is continuously tested about 1032 hours under the same conditions: room temperature of 25° C. and constant current of 40 mA.
Figure 3:
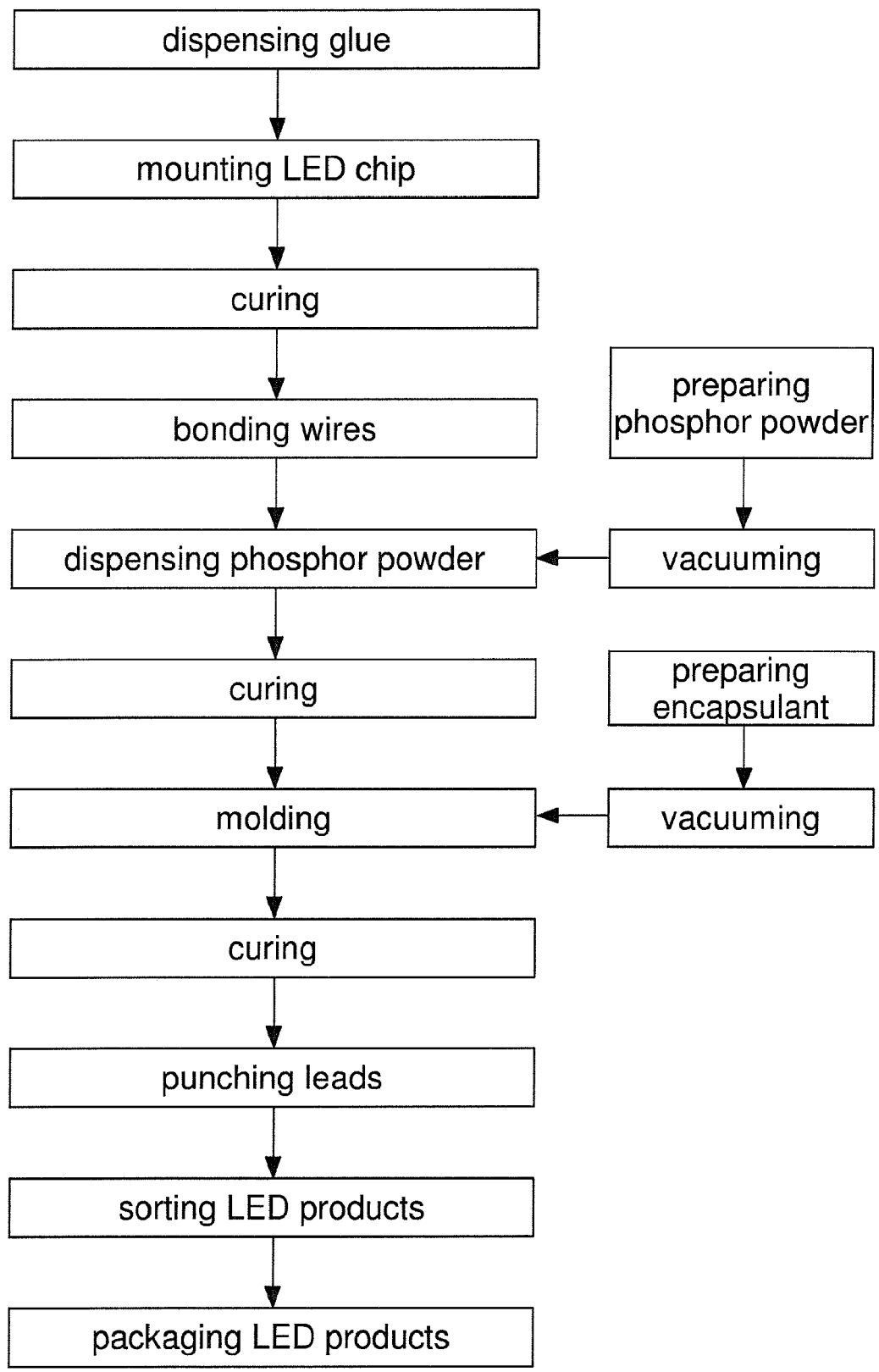
FIG. 3 is a flow chart of packaging a white LED by a glue for packaging a LED according to a preferred embodiment of the present invention.

In the preferred embodiment of the present invention, for verifying the function of reducing luminance decay by the glue for packaging a LED of the present invention, the glue for packaging a LED of the present invention is applied to package a white LED. Referring now to FIG. 3, a flow chart of packaging a white LED is illustrated. As shown, a process of packaging the white LED comprises the following steps of:

Step 1: dispensing a glue, wherein an insulation glue is dispensed into a reflective cup on a leadframe.

Step 2: mounting a LED chip, wherein a prepared LED chip is mounted on the insulation glue in the reflective cup on the leadframe.

Step 3: curing after mounting the LED chip, wherein a semi-finished product mounted with the LED chip is placed into a high-temperature oven for curing the insulation glue, in order to attach the LED chip on the leadframe.

Step 4: bonding wires, wherein two gold wires are bonded on a positive electrode and a negative electrode of the cured LED chip and extended outward, respectively.

Step 5: preparing a phosphor powder, wherein the first set of compositions, the second set of compositions, and the phosphor powder are mixed based on a predetermined weight ratio. Firstly, the first set of compositions and the second set of compositions are mixed and stirred to form a glue for packaging a LED of the present invention. Then, the phosphor powder is added into the glue according to the predetermined weight ratio, and then stirred (stirring time: about 5 minutes).

Step 6: vacuuming, wherein the preparation of the first set of compositions, the second set of compositions, and the phosphor powder is vacuumed to de-bubble (vacuuming time: about 5-10 minutes).

Step 7: dispensing the phosphor powder, wherein the vacuumed preparation of the first set of compositions, the second set of compositions, and the phosphor powder is placed into a syringe of a glue dispenser, and a glue dispensing amount per unit time is suitably adjusted, so that the preparation can be dispensed into the reflective cup of the leadframe bonded with the gold wires.

Step 8: curing after dispensing the phosphor powder, wherein the leadframe with the preparation is placed into a high-temperature oven for curing the glue in the preparation, in order to solidify the glue (curing temperature: 130-150° C., curing time: 1-2 hours).

Step 9: preparing an encapsulant, wherein pre-heated components A and B of epoxy glue are prepared according to a predetermined weight ratio (generally, 1:1), and then stirred to completely mix the components A and B to form an encapsulant preparation.

Step 10: vacuuming, wherein the encapsulant preparation of step 9 is vacuumed to de-bubble (vacuuming time: about 5-10 minutes).

Step 11: molding, wherein the encapsulant is injected into a mold cavity, where the leadframe is placed, in turn by a molding machine.

Step 12: curing after molding, wherein the injected encapsulant of step 11 is cured under high temperature, in order to solidify the encapsulant (curing temperature: 125° C., curing time: 8-10 hours)

Step 13: punching leads of the leadframe, wherein leads of the positive electrode and the negative electrode of the leadframe can be punched and separated from each other by a punching machine.

Step 14: sorting, wherein LED products manufactured by the foregoing steps can be sorted by a light sorting machine according to voltage, brightness, color, and other related electrical parameters of the LED products. Finally, packaging the sorted LED products to finish the LED products.

In the preferred embodiment of the present invention, the LED chip is selected from blue LED chip which has a blue light emitting wavelength of 455-465 nm; the glue is selected from an insulation glue; the phosphor powder is selected from silicate phosphor powder; the leadframe of the LED product is selected from a metal leadframe, such as iron or copper leadframe; the preparing the phosphor powder is selected from the glue for packaging a LED of the present invention, which is prepared by mixing the first set of compositions with the second set of compositions based on a weight ratio of 1:1; and the phosphor powder, the first set of compositions, and the second set of compositions are mixed based on a weight ratio of 1:3:3. It should be noted that the phosphor powder can be further selected from the group consisting of YAG (yttrium-aluminum-garnet) powder, TAG (terbium-aluminum-garnet) powder, sulfide powder, and mixture thereof.

Figure 4:
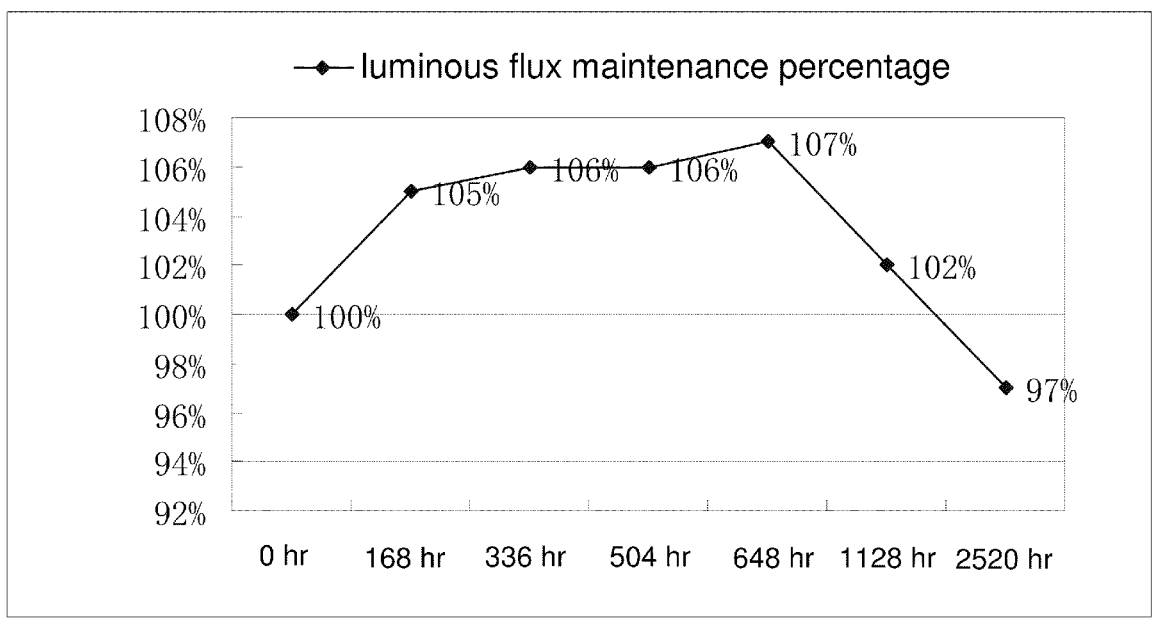
FIG. 4 is a graph of a luminance decay profile of the white LED packaged by the glue for packaging a LED according to the preferred embodiment of the present invention, wherein the LED is continuously tested about 2520 hours under the same conditions: room temperature of 25° C. and constant current of 25 mA.

For verifying the luminance decay condition of the white LED packaged by the glue for packaging a LED according to the preferred embodiment of the present invention, the white LED is tested by a series of measurements. Referring now to FIG. 4, a graph of a luminance decay profile of the white LED packaged by the glue for packaging a LED according to the preferred embodiment of the present invention is illustrated, wherein the LED is continuously tested about 2520 hours under the same conditions: room temperature of 25° C. and constant current of 25 mA. As shown, the luminous flux maintenance percentage at $168^{th}$ hour is 105%, the luminous flux maintenance percentage at $336^{th}$ hour is 106%, the luminous flux maintenance percentage at $504^{th}$ hour is 106%, the luminous flux maintenance percentage at $648^{th}$ hour is 107%, the luminous flux maintenance percentage at $1128^{th}$ hour is 102%, and the luminous flux maintenance percentage at $2520^{th}$ hour is 97%, wherein the rate of luminance decay at $2520^{th}$ hour is only 3%.

Figure 5:
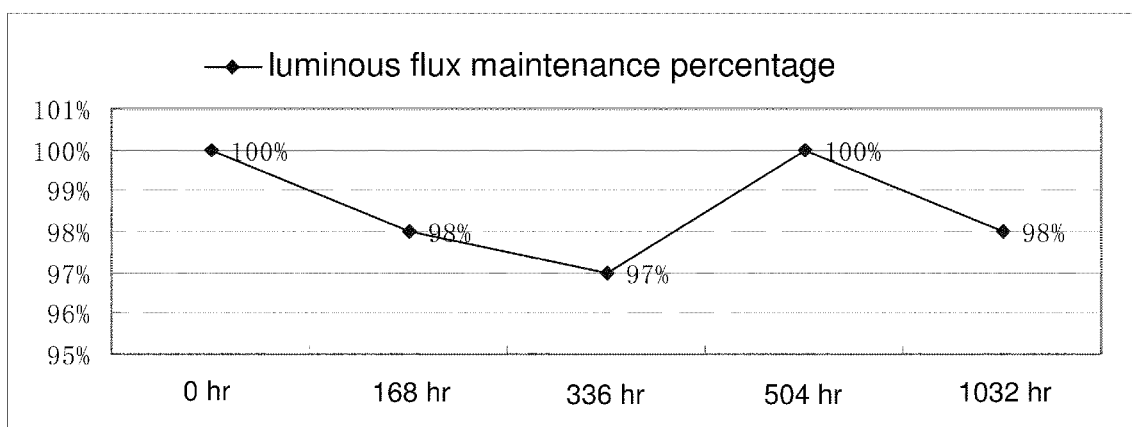
FIG. 5 is a graph of a luminance decay profile of the white LED packaged by the glue for packaging a LED according to the preferred embodiment of the present invention, wherein the LED is continuously tested about 1032 hours under the same conditions: room temperature of 25° C. and constant current of 40 mA.

For further verifying the luminance decay condition of the white LED, the white LED is tested by a series of measurements. Referring now to FIG. 5, a graph of a luminance decay profile of the white LED packaged by the glue for packaging a LED according to the preferred embodiment of the present invention is illustrated, wherein the LED is continuously tested about 1032 hours under the same conditions: room temperature of 25° C. and constant current of 40 mA. As shown, the rate of luminance decay at $168^{th}$ hour is 2%, the rate of luminance decay at $336^{th}$ hour is 3%, the rate of luminance decay at $504^{th}$ hour is 0%, and the rate of luminance decay at $1032^{th}$ hour is only 2% advantageously.

As described above, when the glue for packaging a LED according to the preferred embodiment of the present invention is used to package the white LED, it is advantageous to efficiently reduce the luminance decay of the white LED.

For further verifying the function for reducing luminance decay of the white LED by the glue for packaging a LED according to the preferred embodiment of the present invention, the glue for packaging a LED is applied to package a LED by another packaging method. For example, the glue for packaging a LED can be applied to form a transparent medium layer on a light emitting surface of a LED chip. Then, the LED packaged by the foregoing packaging method is tested, it is found that the luminance decay of the LED is apparently reduced.

It should be noted that the same conditions as described above further means: (1) each of test experiments is carried out under the same laboratory, period, and environmental conditions; and (2) each of test cases selects 20 LED products as random test samples from a number of LED products.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A glue for packaging a light emitting diode (LED), comprising:
   a first set of compositions including poly(dimethyl siloxane); and
   a second set of compositions mixed with the first set of compositions based on a weight ratio and including a copolymer of dimethyl siloxane, methyl hydrogen siloxane, and vinyl siloxane;
   wherein the copolymer in the second set of compositions has a weight percentage from about 94% to 99%; the weight percentage of dimethyl siloxane in the copolymer is 87%, the weight percentage of methyl hydrogen siloxane in the copolymer is 7%, and the weight percentage of vinyl siloxane in the copolymer is 4%.

2. The glue of claim 1, wherein the second set of compositions further includes γ-(2,3-epoxypropoxy)propyl trimethoxysilane, and γ-(2,3-epoxypropoxy)propyl trimethoxysilane in the second set of compositions has a weight percentage from about 0.5% to 3%.

3. The glue of claim 2, wherein the weight percentage of γ-(2,3-epoxypropoxy)propyl trimethoxysilane in the second set of compositions is 1%.

4. The glue of claim 1, wherein the second set of compositions further triethoxy methyl silane and triethoxy methyl silane in the second set of compositions has a weight percentage from about 0.5% to 3%.

5. The glue of claim 4, wherein the weight percentage of triethoxy methyl siloxane in the second set of compositions is 1%.

6. The glue of claim 1, wherein the first set of compositions and the second set of compositions are mixed based on a weight ratio of 1:1.

* * * * *